(12) United States Patent
Lindsey et al.

(10) Patent No.: US 7,696,760 B2
(45) Date of Patent: Apr. 13, 2010

(54) HIGH VOLTAGE HARNESS TESTING SYSTEM

(75) Inventors: Robert W. Lindsey, Washington, IL (US); Curtis Brian Johnson, Peoria, IL (US); Rex Aaron Glover, Deer Creek, IL (US)

(73) Assignee: Caterpillar Inc., Peoria, IL (US)

( * ) Notice: Subject to any disclaimer, the term of this patent is extended or adjusted under 35 U.S.C. 154(b) by 244 days.

(21) Appl. No.: 11/987,543

(22) Filed: Nov. 30, 2007

(65) Prior Publication Data

US 2009/0140748 A1 Jun. 4, 2009

(51) Int. Cl.
G01R 31/04 (2006.01)
G01R 31/14 (2006.01)

(52) U.S. Cl. ...................... 324/538; 702/117
(58) Field of Classification Search ................ 324/538, 324/537, 500, 539, 541, 543, 544, 66, 67, 324/76.11; 702/58, 108, 117, 118
See application file for complete search history.

(56) References Cited

U.S. PATENT DOCUMENTS

| | | | |
|---|---|---|---|
| 4,414,539 A | 11/1983 | Armer | |
| 4,959,792 A * | 9/1990 | Sullivan | 702/58 |
| 5,237,282 A * | 8/1993 | Boivin | 324/539 |
| 5,280,251 A | 1/1994 | Strangio | |
| 6,081,124 A | 6/2000 | Chiyoda | |
| 6,124,716 A | 9/2000 | Kanamori | |
| 6,356,853 B1 * | 3/2002 | Sullivan | 702/117 |
| 6,687,639 B2 * | 2/2004 | Taniguchi et al. | 702/117 |
| 6,791,336 B2 | 9/2004 | Krigel | |
| 6,833,713 B2 | 12/2004 | Schoepf et al. | |
| 7,057,401 B2 * | 6/2006 | Blades | 324/713 |
| 7,137,839 B2 | 11/2006 | Dilliner et al. | |
| 7,235,953 B2 * | 6/2007 | Aoyama | 322/28 |
| 2006/0108987 A1 * | 5/2006 | Aoyama | 322/28 |

* cited by examiner

*Primary Examiner*—Hoai-An D Nguyen
(74) *Attorney, Agent, or Firm*—Finnegan, Henderson, Farabow, Garrett & Dunner

(57) ABSTRACT

A wire harness testing system is disclosed. The wire harness testing system includes a voltage sensor configured to measure a voltage at a location associated with an electric load, wherein the electric load is connected with at least one wire harness. The wire harness testing system also includes a controller electrically coupled to the voltage sensor. The controller is configured to receive a wire harness test request. The controller is further configured to determine a voltage drop based on a voltage sensor measurement and a reference voltage and compare the voltage drop with a threshold. The controller is also configured to adaptively update the reference voltage with the voltage measurement responsive to a voltage drop below the threshold, and generate a fault notice responsive to a voltage drop above the threshold. The wire harness testing system further includes at least one indication device configured to provide a warning signal based on the fault notice generated by the controller.

20 Claims, 3 Drawing Sheets

HIGH VOLTAGE HARNESS TESTING SYSTEM

TECHNICAL FIELD

This application relates to a harness testing system, and more particularly, to a high voltage harness testing system.

BACKGROUND

Electric or hybrid machines are widely used as alternatives to their mechanical counterparts in industrial applications due to their higher efficiency and lower maintenance requirements. A high voltage power supply system is required for driving these electric machines. For the purpose of the present disclosure, high voltage refers to a voltage greater than 50 volts. The high voltage system usually includes one or more wire harnesses that enable the establishment of electrical power between the various systems of the electric machine. Non-limiting examples of wire harnesses include electrical conductors and connectors. These wire harnesses may be configured to pass various types of electrical signals, including DC voltage potentials and AC voltage signals.

The integrity of the high voltage harness is important to the reliability of the machine. For instance, if the connector components are not fully engaged or properly soldered, or crimped, or other types of connector faults occur, arcs may occur at the connector. Arcs usually contain high energy and generate a large amount of heat that may melt the connector and any conductive components. Therefore, it is desirable to test the harness system and detect connector degradation before arcs occur.

In order to achieve early detection, it is important that the testing system can adaptively account for operating characteristics of loads and sensor measurement errors. For example, each electric machine may include one or more electric loads. Depending on the operating characteristics of the electric loads, the currents flowing through these electric loads, as well as the voltages associated with them, may vary significantly. As a result, voltage levels at multiple points of a high voltage system may fluctuate significantly, depending on the electric loads connected to the system. For another example, sensor precision may also vary among different sensors and affect the voltage measurement.

One system for testing a wire harness in a high-voltage electrical circuit is described in Schoepf et al. U.S. Pat. No. 6,833,713 ("the '713 patent"). The '713 patent describes a wire harness testing system for detecting arc faults. The system includes two smart connectors connected in series with two terminals of a circuit portion being tested. Each smart connector includes electronic circuitry to measure both voltage and current. The system further includes two signal wires to transfer the values of the end voltage and end current from the end smart connector to the beginning smart wire. The testing system described in the '713 patent may compare the voltage difference between the two smart connectors with a preset value. In one instance, the wire harness testing system described in the '713 patent may further include a switching device that disconnects the power supply to the smart connectors in the event of arc faults.

Although the wire harness testing system described in the '713 patent may be effective for testing wire harness and detecting arc faults, it may be problematic. For example, the testing system described in the '713 patent is only capable of detecting an arc fault when it occurs, but does not provide early and preventative detection. For example, the system of the '713 patent does not use adaptive reference voltages and thus a voltage difference due to large resistance of electric loads being tested may be mistakenly detected as an arc fault.

Furthermore, the system described in the '713 patent may be too complex. For example, the system described in the '713 patent requires external smart connectors and additional wirings to perform the test. In addition, the solution provided by the '713 patent may not be convenient to use. For example, the wire harness test described in the '713 patent has to be formed manually by skilled electrical engineers since the system requires re-wiring and connection of external components.

The disclosed high voltage harness testing system is directed towards improvement in the existing technology.

SUMMARY

In one aspect, the present disclosure is directed to a wire harness testing system. The wire harness testing system may include a voltage sensor configured to measure a voltage at a location associated with an electric load, wherein the electric load is connected with at least one wire harness. The wire harness testing system may also include a controller electrically coupled to the voltage sensor. The controller may be configured to receive a wire harness test request. The controller may be further configured to determine a voltage drop based on a voltage sensor measurement and a reference voltage and compare the voltage drop with a threshold. The controller may also be configured to adaptively update the reference voltage with the voltage measurement responsive to a voltage drop below the threshold, and generate a fault notice responsive to a voltage drop above the threshold. The wire harness testing system may further include at least one indication device configured to provide a warning signal based on the fault notice generated by the controller.

In another aspect, the present disclosure is directed toward a method of testing wire harnesses. The method may include receiving a wire harness test request, and measuring a voltage associated with an electric load, based on the test request. The method may further include determining a reference voltage based on characteristic data of the electric load, determining a voltage drop as a difference between the voltage measurement and the reference voltage, and comparing the voltage drop with a threshold. The method may yet further include adaptively updating the reference voltage with the voltage measurement responsive to a voltage drop below the threshold, and generating a fault notice responsive to a voltage drop above the threshold. The method may also include providing at least one warning signal based on the fault notice.

DETAILED DESCRIPTION

Figure 1:
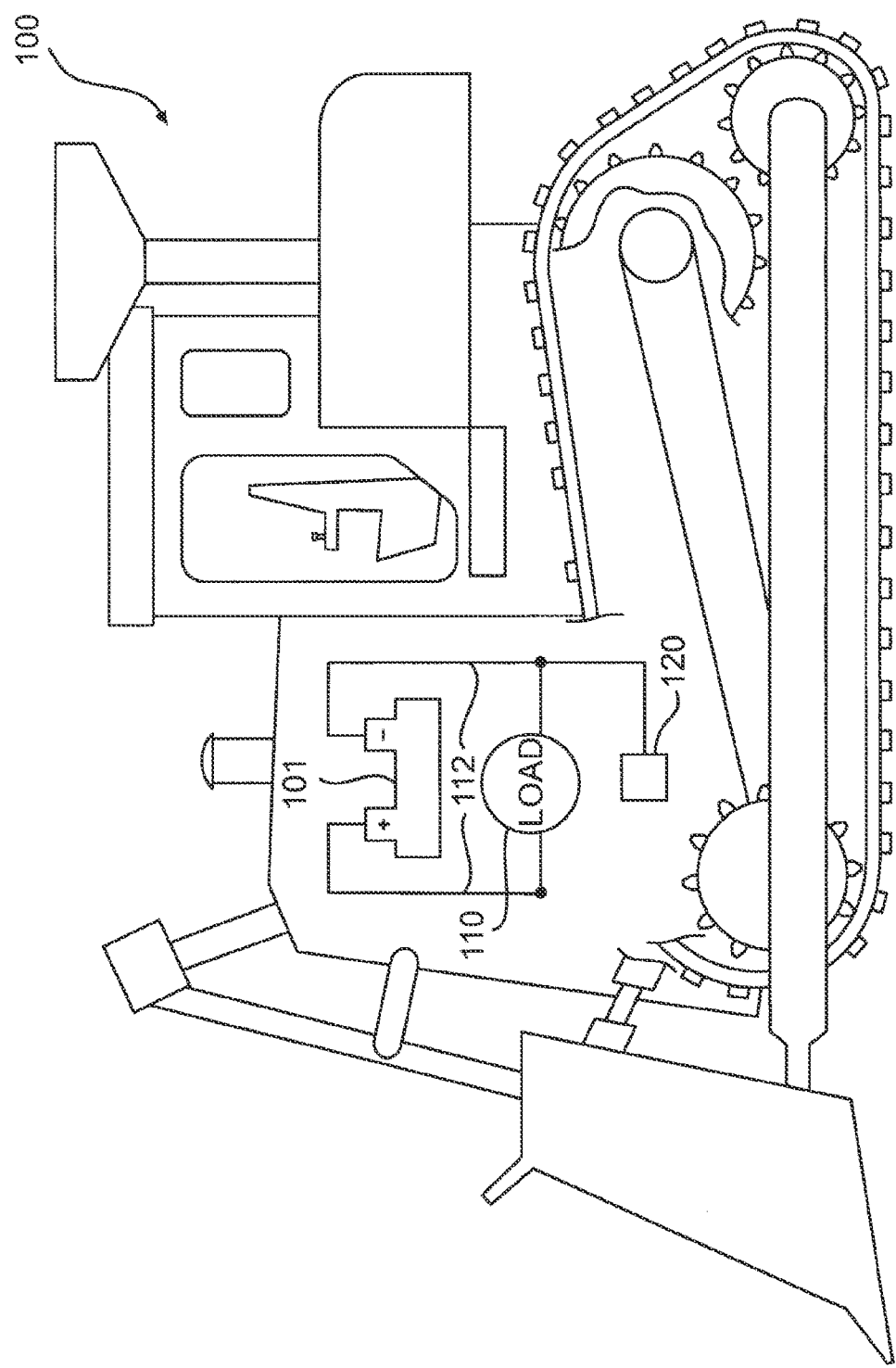
FIG. 1 illustrates a machine consistent with an exemplary disclosed embodiment.

FIG. 1 illustrates an exemplary disclosed machine 100 consistent with certain disclosed embodiments. Machine 100 may include, among other things, a power source 101, one or more electric loads 110, and a wire harness testing system 120. Machine, as the term is used herein, refers to a fixed or mobile machine that may perform some type of operation associated with a particular industry, such as mining, construction, farming, etc. and operate between or within work environments (e.g., a construction site, mine site, power plant, etc.) A non-limiting example of a fixed machine includes an engine system operating in a plant or off-shore environment (e.g., off-shore drilling platform). Non-limiting examples of mobile machines include commercial machines, such as trucks, cranes, earth moving vehicles, mining vehicles, backhoes, material handling equipment, farming equipment, marine vessels, on-highway vehicles, or any other type of movable machine that operates in a work environment.

Power source 101 may include various components configured to provide electric power for use by one or more systems of machine 100. For instance, power source 101 may include a generator driven by an engine, such as a combustion engine. Alternatively, power source 101 may include any other suitable device for providing a power output such as, for example, a battery, a fuel cell, or any other type of power source configured to provide electrical power to machine 100. Consistent with one disclosed embodiment, if power source 101 provides a voltage supply higher than 50 volts, the associated power system is considered as a high voltage system.

According to one embodiment, electric load 110 may be an electric motor, such as, for example, an AC induction motor, a brushless DC motor, a variable or switched reluctance motor, a stepper motor, a linear motor, or any other type of motor. The electric motor may be coupled to power source 101 and may be configured to convert at least a portion of the electric power output from power source 101 to mechanical energy for performing a task associated with machine 100. Electric load 110 may also be of various other devices and accessories on a high-voltage system such as an electronic battery charger, an electric pump controller, an air conditioner, and electric fan, and other electrical loads.

Electric load 110 may be connected to one or more wire harnesses 112. According to one embodiment, wire harness 112 may be an electrical connector. An electrical connector may include a female component having one or more receptacles, and a male component having one or more terminals configured to engage the one or more receptacles. In addition, wire harness 112 may be at least one electrical conductors that transfers power from the power source to load 110. The electrical harness may degrade during the process of use. For example, the electrical harness may be pinched, or a connector may have disengaged or corroded terminals. Where there is electrical connector degradation under an electrical load, an arc may occur between the female component and male component in the electrical connector. A resulting load current may be significantly lower than the trip current of the protection devices such as fuses and circuit breakers. Meanwhile, the voltage present on electric load 110 may be significantly lower than the voltage level of the high voltage system. If not detected and cleared in time, the existence of the arc may cause damage to electric load 110 and other components associated with machine 100.

According to one embodiment, wire harness testing system 120 may be included as an integral part of the high voltage system, such as part of a power control system for machine 100. Alternatively, according to another embodiment, wire harness testing system 120 may be external to the high voltage system, such as, for example, part of a separate electronic control module (ECM) associated with machine 100.

Wire harness testing system 120 may be coupled to electric load 110 and configured to test the wire harness associated with electric load 110 and provide an indication of harness fault. For example, wire harness testing system 120 may be electrically connected to an energizing terminal of electric load 110 to measure the voltage potential associated with the terminal. According to one embodiment, wire harness testing system 120 may be configured to detect a voltage drop at one or more points associated with electric load 110. Wire harness testing system 120 may determine if a harness fault exists (e.g., the detected voltage drop is above a threshold voltage value correlated to electric load 110) and provide an audible and/or visual warning signal indicative of the harness fault. Alternatively or additionally, wire harness testing system 120 may also provide a display of the harness fault.

According to one embodiment, a wire harness test may be performed discretely upon initialization. For example, a wire harness test may be initiated by a user generated test request via a user input interface. Alternatively, a test may be initiated automatically by the power control system at a certain event of machine 100, for example, a key-on event. According to another embodiment, wire harness testing system 120 may continuously and/or periodically monitor the voltage levels at one or more points of electric load 110. When a harness fault is detected, wire harness testing system 120 may provide one or more continuous warning signals until the harness fault has been cleared. Wire harness testing system 120 may also automatically disconnect the electric load 110.

According to one embodiment, a user of wire harness system 120 may modify the threshold value of the voltage drop. For example, the user may input the threshold value in volts or in a percentage value via the user input interface at the time of requesting a test. Additionally, a user may modify the reference voltage value associated with an electric load being tested. Alternatively, wire harness testing system 120 may adaptively and automatically modify the reference voltage value based on real voltage measurements. Thus, wire harness testing system 120 may be scaled to operate in systems with various voltage levels and sensitivity requirements.

Figure 2:
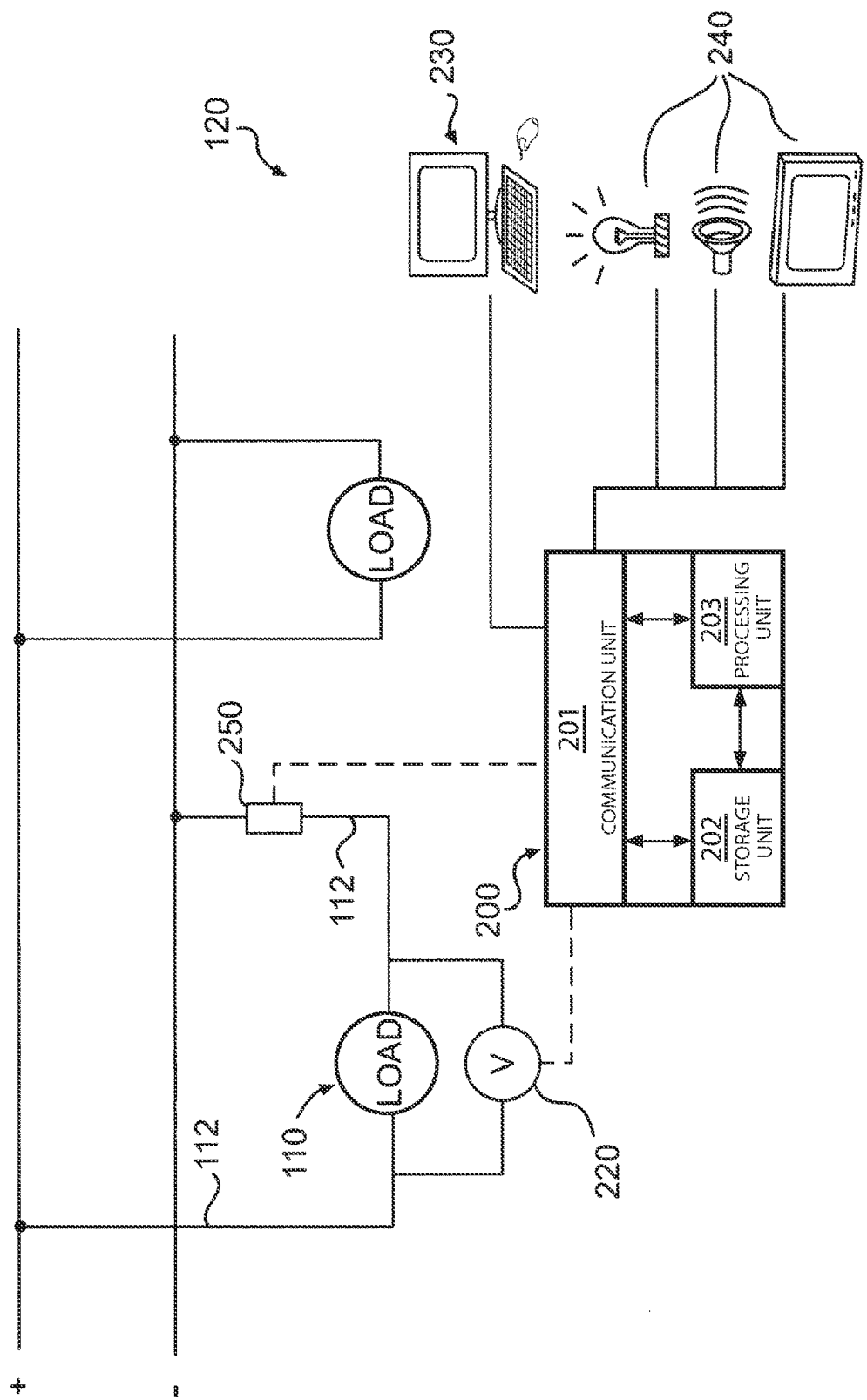
FIG. 2 provides a block diagram of a wire harness system consistent with an exemplary disclosed embodiment.

As illustrated in the block diagram of FIG. 2, wire harness testing system 120 may include, among other things, a controller 200, a voltage sensor 220, a user input interface 230, one or more indication devices 240, and a protection device 250. Voltage sensor 220 may be electrically connected to one or more points in the high voltage system associated with electric load 110 and its one or more wire harnesses 112. Controller 200 may be electrically coupled to and communicate with voltage sensor 220, user input interface 230, one or more indication devices 240, and protection device 250.

Voltage sensor 220 may be configured to measure a voltage at a certain point of the high voltage system associated with electric load 110 having wire harness 112. The measured voltage is normally at the voltage level of the high voltage system. However, depending on the power demand or usage of electric load 110, the measured voltage may fluctuate around the voltage level of the high voltage system. The fluctuation level may be decided by the operating characteristic of electric load 110, for example, the resistance of electric load 110 and the load current flowing through electric load 110. Operating characteristics may vary largely among different electric loads. For example, an electric pump controller may have different operating characteristics than an air conditioner. Therefore, to properly detect a harness fault associated with electric load 110, it is beneficial to use an adaptive reference voltage accounting for the operating characteristics of electric load 110.

According to one embodiment, voltage sensor 220 may be external to electric load 110 and may be connected to the high voltage system each time a wire harness test is performed. According to another embodiment, voltage sensor 220 may be an integrated part of electric load 110.

Controller 200 may be electrically coupled to and communicate with voltage sensor 220. Controller 200 may be configured to receive a wire harness test request and receive a voltage measurement from voltage sensor 220 associated with an electric load specified by the test request. Controller 200 may be further configured to determine a voltage drop based on the measured voltage and a reference voltage value, and configured to determine whether the voltage drop is above a set threshold. According to one embodiment, controller 200 may be coupled to a user input interface 230 to receive the test request from a user. According to another embodiment, controller 200 may also be coupled to receive the test request from the machine control system at a certain event. Controller 200 may further be coupled to one or more indication devices 240 to indicate the fault and/or display the fault. Controller 200 may also be coupled to a protection device 250 to automatically disconnect the faulty wire harness and protect electric load 110.

Controller 200 may include, among other things, a communication unit 201, a storage unit 202, and a processing unit 203. Communication unit 201, storage unit 202, and processing unit 203 may be configured to communicate with each other. For example, communication unit 201, storage unit 202, and processing unit 203 may be physically connected by cables or other communication lines. For another example, communication unit 201, storage unit 202, and processing unit 203 may be connected by a wireless network, or by other forms of propagating waves. According to one disclosed embodiment, communication unit 201, storage unit 202, and processing unit 203 may communicate with one another to transfer data and/or send and/or receive instructions.

Communication unit 201 may include an analogue to digital converter (ADC), a data buffer, and a control signal generating device. Communication unit 201 may be coupled to voltage sensor 220 and configured to receive voltage measurements, sample the received voltage signal (if voltage sensor 220 is an analog voltage sensor) and store data in the data buffer. Communication unit 201 may be further configured to generate control signals to switch off protection device 250 upon the detection of a harness fault.

Consistent with one disclosed embodiment, communication unit 201 may also be coupled to the user input interface 230 and configured to receive a test request from a user. Communication unit 201 may send the test request to processing unit 203. The test request may include a list of electric load IDs to specify which electric loads 110 should be included in the test and may include characteristic data of each electric load. The test request may further include other information such as when the test should be performed, how the user should be notified, and whether protection actions should be performed if a fault is detected. Communication unit 201 may be further coupled to one or more indication devices 240 and configured to send the fault notice generated by processor unit 203 to the one or more indication devices 240.

Storage unit 202 may include a memory device such as, for example, a hard disk, a flash drive, a RAM, etc., and be configured to store reference voltage values for all electric loads 110 and a threshold value of the voltage drop. Consistent with one embodiment, the reference voltage values and the threshold value may be determined in advance based on empirical knowledge or previous measurements, and programmed into storage unit 202. Consistent with another disclosed embodiment, the reference voltage values may be saved into storage unit 202 periodically and adaptively during the test. For example, if wire harness testing system 120 determines that the wire harness is working properly, the voltage measurement acquired by voltage sensor 220 associated with a particular electric load 110 may be adaptively saved as the reference voltage for that particular electric load 110. The reference voltage values may be stored in a look up table in storage unit 202 and each reference voltage may correspond to one electric load 110. The threshold value of the voltage drop is indicative of the sensitivity of the wire harness testing system. The threshold value may be a number in volt (e.g., 10 volts), or alternatively a percentage number (e.g., 20%).

Processing unit 203 may include a processing device and a data buffer. The processing device may be, for example, a CPU, a microprocessor, a digital signal processor (DSP), or any suitable procesor. Processing unit 203 may be configured to receive a test request from communication unit 201, process the test request, and send an instruction to communication unit 201 to make an inquiry of one or more voltage sensors 220 associated with electric loads 110, as specified in the test request. Processing unit 203 may also be configured to receive voltage measurements from communication unit 201 and obtain corresponding reference voltage values and the threshold value from storage unit 202. For each electric load, processing unit 203 may operate to determine a voltage drop as the difference between the measured voltage value and the reference voltage value, compare the voltage drop to the threshold value and determine whether a harness fault exists.

Consistent with one disclosed embodiment, processing unit 203 may also be configured to normalize the voltage drop as a percentage of the reference value. Accordingly, the threshold value stored in storage unit 202 is also a percentage value.

Consistent with another disclosed embodiment, based on the testing result, processing unit 203 may determine protection actions to be performed and may send an instruction to communication unit 201. For example, in the event of a harness fault, processing unit 203 may send an instruction to switch the protection device 250 off to protect electric load 110 and the high voltage system.

Consistent with yet another disclosed embodiment, if a voltage drop is determined to be below the threshold value, and thus the wire harness is working properly, processing unit 203 may be configured to send the measured voltage value to storage unit 202 and adaptively update the reference voltage stored for the corresponding electric load. Alternatively, processing unit 203 may also be configured to take an average of several voltage measures associated with the same electric load, and store the average voltage value in storage unit 202.

User input interface 230 may be a computer, an operator console, or a handheld operator panel. User input interface 230 may be coupled to controller 200 via communication cables, wireless networks, or other communication mediums. User input interface 230 may include graphic interface for user input and a processor for generating a test request. According to one embodiment, user input interface 230 may include a keyboard and/or a mouse. According to another embodiment, user input interface 230 may include a touch screen. User input interface 230 may be configured to generate a test request based on the user inputs, and configured to send the test request to communication unit 201. Consistent with one embodiment, user input interface may also be used by a user to modify the threshold value of voltage drop.

One or more indication devices 240 may be operatively coupled to controller 200, and configured to provide one or more warning signals indicative of a harness fault associated with electric load 110 to a user of machine 100. For instance, indication devices 240 may include any component configured to provide a warning signal to a user associated with machine 100 such as, for example, a visual device (e.g., warning lamp, LCD display, LED lamp, etc.); an audible device (e.g., speaker, bell, chime, etc.); a wireless device (e.g., cell phone, pager, etc.); or any other type of output device. In one embodiment, an LED lamp may be coupled with an audible alarm to provide a combination audio/visual warning. In another embodiment, the warning signal may trigger an event recorder to store the voltage drops to memory device for later review.

One indication device 240 may be a display device, for example, a computer, an operator panel, or an LCD for displaying the harness fault. According to one embodiment, the display device may be an integral part of user input interface 230. The indication device 240 may include a screen that displays the fault on the screen. Consistent with one embodiment, the fault notice may be displayed as a text file. Consistent with one embodiment, the fault notice may also be displayed as a diagrammatic chart including a configuration of the high voltage system, graphic views of individual electric load, and harness fault locations marked in a notable manner.

Protection device 250 may be any of various devices that may disconnect the circuit connection and discharge the wire harness. For example, protection device 250 may be an electrical switch controlled by controller 200. The electrical switch may be closed and may permit current flow during normal operations, and may be triggered open when a harness fault is detected.

Figure 3:
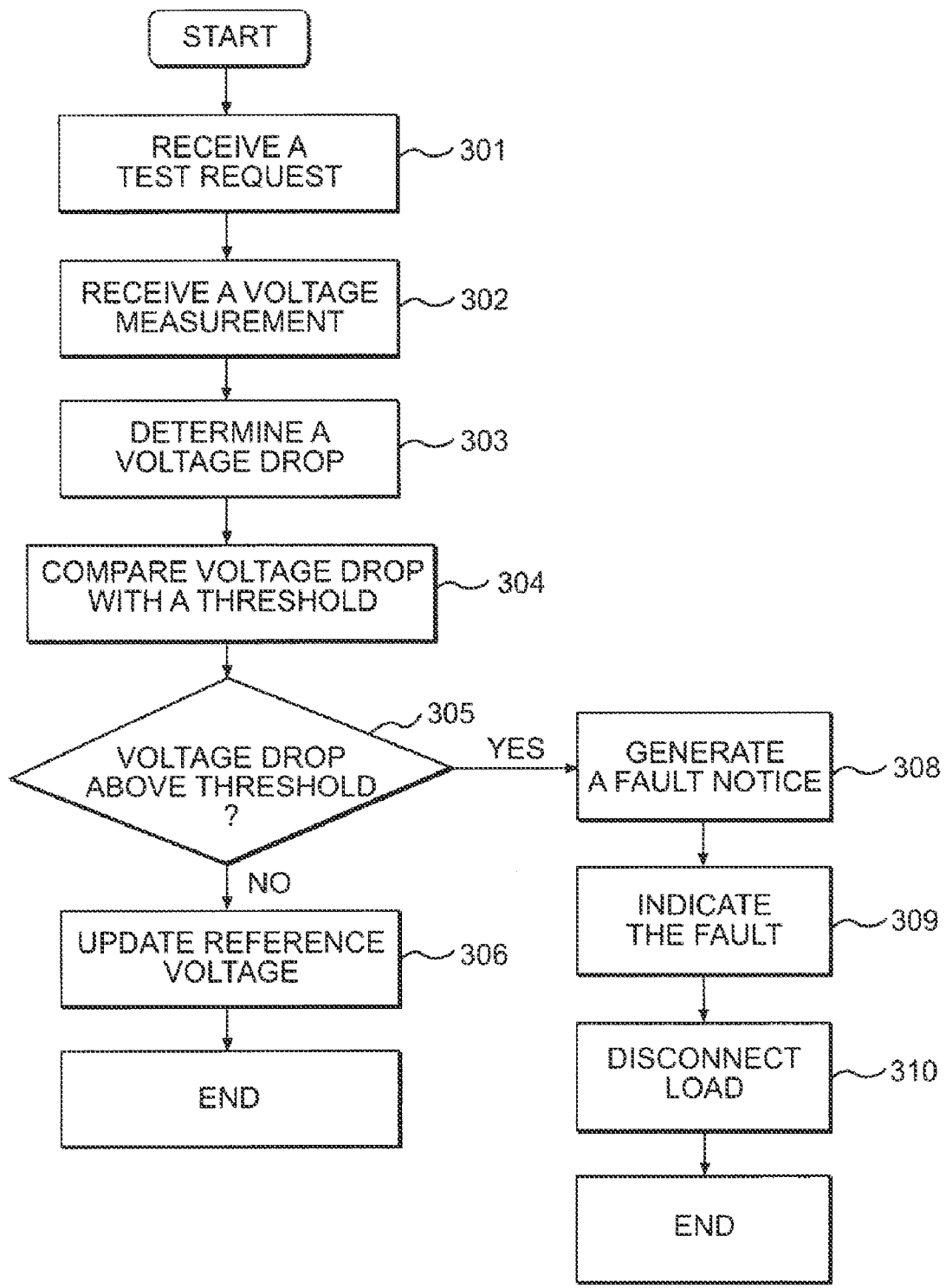
FIG. 3 provides a flowchart of an exemplary operation process for testing wire harnesses and indicating a fault, consistent with the disclosed embodiment shown in FIG. 2.

FIG. 3 shows a flowchart of an exemplary operation process for testing a wire harness and indicating a fault, consistent with the disclosed embodiment shown in FIG. 2. FIG. 3 will be discussed in more detail in the following section to further illustrate the disclosed system and its operation.

INDUSTRIAL APPLICABILITY

Although the disclosed embodiments are described in association with a high-voltage harness testing system for a machine, the disclosed wire harness testing system may be used in any environment where it may be desirable to monitor a voltage drop and provide an indication when the voltage drop is out of a normal range. Specifically, the disclosed wire harness system may detect a voltage level associated with a point in a circuit, determine a voltage drop based on the measured voltage level and a reference voltage level, compare the voltage drop to a threshold value, and provide an indication of harness fault if the voltage drop is above the threshold. Moreover, the disclosed wire harness testing system may be configured to adaptively update the reference voltage values with new voltage measurements, to account for the operating characteristics of different loads in the circuit.

FIG. 3 shows a flowchart of an exemplary operation process for testing a wire harness and indicating a fault, consistent with the disclosed embodiment shown in FIG. 2. As shown in FIG. 3, controller 200 may first operate to receive a wire harness test request (step 301). The test request may be initiated by a user, such as an operator of the machine, via user input interface 230, for example. Alternatively, the test request may also be initiated automatically by the machine control system, based on certain events of the machine. For example, a test request may be initiated at the "key-on" time.

Upon receiving the test request, controller 200 may then operate to receive a voltage measurement from a voltage sensor connected to a testing point associated with electric load 110 (step 302). Controller 200 may operate to obtain a reference voltage correlated with electric load 110 (step 302) from a look-up table stored in storage unit 202. Controller 200 may then operate to determine a voltage drop as the difference between the measured voltage value and the reference voltage value (step 303). Consistent with one disclosed embodiment, in step 303, controller 200 may further operate to normalize the voltage drop as a percentage of the reference voltage value.

According to the exemplary process shown in FIG. 3, controller 200 may then operate to compare the voltage drop with a threshold value (step 304) and determine whether the voltage drop is above the threshold value (step 305). Consistent with one embodiment, the threshold value may be set and programmed into storage unit 202 and controller 220 may operate to obtain the threshold from storage unit 202. Consistent with another embodiment, the threshold value may be provided and input by a user via user input interface 230. For example, the user may choose to input a greater threshold value for a higher voltage system. For another example, the user may adjust the sensitivity of the wire harness testing system by inputting a different threshold value.

If the voltage drop is above the threshold value, controller 200 may operate to adaptively update the reference voltage correlated with electric load 110 with the measured voltage value or an average of several measured voltage values (step 306). If the voltage drop is above the threshold value, controller 200 may operate to generate a fault notice (step 308). The fault notice may include, among other things, a header, a summary of wire harnesses tested, a summary of faults, and a description of the fault locations.

Controller 200 may further operate to send the fault notice to indication devices 240 and provide warning signals and/or a display of the fault notice (step 309). Based on the test request, controller 200 may also operate to disconnect electric load 110 and wire harness 112 to protect the components in the high voltage system.

According to one embodiment of the present application, wire harness testing system 120 may be sensitive to and may provide early detection and indication of a wire harness degradation at its early stage before arcs occur at the harness. For example, controller 200 may adaptively and automatically update the reference voltage values correlated to different electric loads 110 with measured voltage values. The adaptive reference voltage value successfully accounts for operating characteristics of electric load 110 and measurement errors of voltage sensor 220. As a result, a voltage drop calculated based on the adaptive reference voltage can be reliably employed to determine whether a harness fault exists. A relatively small threshold may be set to obtain a higher sensitivity of the testing system.

According to one embodiment of the present application, wire harness testing system 120 may incorporate an integrated voltage sensor in the electric machine. Controller 200 may also be integrated as part of the machine control system and may share the use of an existing controller. Therefore, wiring complexity is reduced to a minimum extent. No additional wiring or components may be needed, resulting in wire harness testing system 120 that may be very cost-effective.

In addition, the use of wire harness testing system 120 may be more convenient than conventional current sensor testing systems. Since the test may be performed without any re-wiring of the circuit or connection of external components, it does not require any skilled personnel to perform the test. Moreover, a user input interface 230 may be provided for user input. The user may initiate a test by simply pushing a button. The user may also choose to input test details that are to be included in an automatically generated test request. In addition, a warning signal may be provided to the user, and/or a fault notice may be displayed in a user friendly form.

It will be apparent to those skilled in the art that various modifications and variations can be made to the disclosed high voltage harness testing system without departing from the scope of the disclosure. Other embodiments of the present disclosure will be apparent to those skilled in the art from consideration of the specification and practice of the disclosed embodiments. It is intended that the specification and examples be considered as exemplary only, with a true scope of the present disclosure being indicated by the following claims.

What is claimed is:

1. A wire harness testing system, comprising:
a voltage sensor configured to measure a voltage at a location associated with an electric load, wherein the electric load is connected with at least one wire harness;
a controller electrically coupled to the voltage sensor, and being configured to:
receive a wire harness test request;
determine a voltage drop based on a voltage sensor measurement and a reference voltage;
compare the voltage drop with a threshold;
adaptively update the reference voltage with the voltage measurement responsive to the voltage drop being below the threshold; and
generate a fault notice responsive to the voltage drop being above the threshold; and
at least one indication device configured to provide a warning signal based on the fault notice generated by the controller.

2. The wire harness testing system of claim 1, further including a user input interface configured to receive user input to initiate a test request.

3. The wire harness testing system of claim 1, wherein the controller further includes a storage unit configured to store the reference voltage and characteristic data associated with the electric load.

4. The wire harness testing system of claim 1, wherein the at least one indication device is an operator panel configured to display results of the fault notice.

5. The wire harness testing system of claim 1, wherein the voltage sensor is integrated with the electric load.

6. A method of testing a wire harness, comprising:
receiving a wire harness test request;
measuring a voltage associated with an electric load, based on the test request;
determining a reference voltage based on characteristic data of the electric load;
determining a voltage drop as a difference between the voltage measurement and the reference voltage;
comparing the voltage drop with a threshold;
adaptively updating the reference voltage with the voltage measurement responsive to the voltage drop being below the threshold;
generating a fault notice responsive to the voltage drop being above the threshold; and
providing at least one warning signal based on the fault notice.

7. The method of claim 6, further including initiating a test request by a user via a user input interface.

8. The method of claim 6, further including adjusting the threshold by a user via a user input interface.

9. The method of claim 6, further including normalizing the voltage drop and the threshold of the voltage drop based on the reference voltage.

10. The method of claim 6, further including repetitively measuring the voltage and adaptively updating the reference voltage with an average value of a plurality of voltage measurements.

11. The method of claim 6, further including displaying faults based on the fault notice.

12. The method of claim 6, further including automatically disconnecting the wire harness from its power source responsive to detection of a fault.

13. The method of claim 6, further including testing a first wire harness associated with a first electric load, and testing at least a second wire harness associated with a second electric load.

14. The method of claim 6, further including correlating the reference voltage to usage power demand of the electric load being tested.

15. A machine, comprising:
a power source;
an electric load coupled to receive power from the power source, wherein the electric load is connected with at least one wire harness; and
a wire harness testing system operatively coupled to test the wire harness associated with the electric load, wherein the wire harness testing system includes:
a voltage sensor configured to measure a voltage at a point associated with the electric load;
a controller electrically coupled to the voltage sensor, and being configured to:
receive a wire harness test request;
determine a voltage drop based on a voltage sensor measurement and a reference voltage;
compare the voltage drop with a threshold;
adaptively update the reference voltage with the voltage measurement responsive to the voltage drop being below the threshold; and
generate a fault notice responsive to the voltage drop being above the threshold; and
at least one indication device configured to provide a warning signal based on the fault notice generated by the controller.

16. The machine of claim 15, wherein the at least one indication device is an operator panel configured to display results of the fault notice.

17. The machine of claim 15, wherein the voltage sensor is integrated with the electric load.

18. The machine of claim 15, wherein the power source is a high voltage power source higher than 50 volts.

19. The machine of claim 15, wherein the wire harness is an electrical connector.

20. The machine of claim 15, wherein the wire harness is an electrical conductor.

* * * * *